(12) United States Patent
Westerberg et al.

(10) Patent No.: US 12,142,700 B2
(45) Date of Patent: *Nov. 12, 2024

(54) SOLAR CELL EMITTER REGION FABRICATION WITH DIFFERENTIATED P-TYPE AND N-TYPE ARCHITECTURES AND INCORPORATING DOTTED DIFFUSION

(71) Applicant: Maxeon Solar Pte Ltd., San Jose, CA (US)

(72) Inventors: Staffan Westerberg, Sunnyvale, CA (US); Gabriel Harley, Mountain View, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/095,769

(22) Filed: Jan. 11, 2023

(65) Prior Publication Data
US 2023/0163225 A1  May 25, 2023

Related U.S. Application Data

(60) Continuation of application No. 17/068,748, filed on Oct. 12, 2020, now Pat. No. 11,581,443, which is a
(Continued)

(51) Int. Cl.
*H01L 31/0224* (2006.01)
*H01L 31/0236* (2006.01)
(Continued)

(52) U.S. Cl.
CPC ........... *H01L 31/022441* (2013.01); *H01L 31/02363* (2013.01); *H01L 31/035281* (2013.01);
(Continued)

(58) Field of Classification Search
None
See application file for complete search history.

(56) References Cited

U.S. PATENT DOCUMENTS 7,718,888 B2   5/2010   Cousins
7,737,357 B2   6/2010   Cousins
(Continued)

FOREIGN PATENT DOCUMENTS

CN   102099927 A   6/2011
CN   102428565 A   4/2012
(Continued)

OTHER PUBLICATIONS

Rim, Seung Bum, et al., U.S. Appl. No. 14/136,751 entitled "Solar Cell Emitter Region Fabrication With Differentiated P-Type and N-Type Region Architectures" filed Dec. 20, 2013, 36 pgs.
(Continued)

*Primary Examiner* — Eli S Mekhlin
(74) *Attorney, Agent, or Firm* — Schwabe, Williamson & Wyatt, P.C.

(57) ABSTRACT

Methods of fabricating solar cell emitter regions with differentiated P-type and N-type architectures and incorporating dotted diffusion, and resulting solar cells, are described. In an example, a solar cell includes a substrate having a light-receiving surface and a back surface. A first polycrystalline silicon emitter region of a first conductivity type is disposed on a first thin dielectric layer disposed on the back surface of the substrate. A second polycrystalline silicon emitter region of a second, different, conductivity type is disposed on a second thin dielectric layer disposed in a plurality of non-continuous trenches in the back surface of the substrate.

10 Claims, 7 Drawing Sheets

Related U.S. Application Data continuation of application No. 15/831,362, filed on Dec. 4, 2017, now Pat. No. 10,804,415, which is a division of application No. 14/491,045, filed on Sep. 19, 2014, now Pat. No. 9,837,576.

(51) Int. Cl.
  *H01L 31/0352* (2006.01)
  *H01L 31/0745* (2012.01)
  *H01L 31/18* (2006.01)

(52) U.S. Cl.
  CPC ...... *H01L 31/0745* (2013.01); *H01L 31/1872* (2013.01); *Y02E 10/50* (2013.01); *Y02P 70/50* (2015.11)

(56) References Cited

U.S. PATENT DOCUMENTS

| | | | |
|---|---|---|---|
| 8,008,575 | B2 | 8/2011 | De Ceuster et al. |
| 8,766,090 | B2 | 7/2014 | Sewell et al. |
| 8,815,631 | B2 | 8/2014 | Cousins |
| 9,252,301 | B2 | 2/2016 | Morgami et al. |
| 9,257,593 | B2 | 2/2016 | Hashiguchi et al. |
| 9,269,839 | B2 | 2/2016 | Lee et al. |
| 9,362,426 | B2 | 6/2016 | Goto et al. |
| 9,837,576 | B2 * | 12/2017 | Westerberg ..... H01L 31/035281 |
| 10,804,415 | B2 * | 10/2020 | Westerberg ..... H01L 31/035281 |
| 11,581,443 | B2 * | 2/2023 | Westerberg ..... H01L 31/035281 |
| 2009/0308438 | A1 | 12/2009 | De Ceuster et al. |
| 2009/0308457 | A1 | 12/2009 | Smith |
| 2010/0218821 | A1 | 9/2010 | Kim et al. |
| 2010/0230776 | A1 | 9/2010 | Gogoi |
| 2011/0303280 | A1 | 12/2011 | Pawlak et al. |
| 2012/0138135 | A1 | 6/2012 | Manning |
| 2012/0266951 | A1 | 10/2012 | Li et al. |
| 2013/0032206 | A1 | 2/2013 | Yokosawa et al. |
| 2013/0045562 | A1 | 2/2013 | Liu et al. |
| 2013/0104974 | A1 | 5/2013 | Kim et al. |
| 2013/0160833 | A1 | 6/2013 | Loscutoff et al. |
| 2013/0164878 | A1 | 6/2013 | Cousins |
| 2013/0164883 | A1 | 6/2013 | Moslehi et al. |
| 2013/0247965 | A1 | 9/2013 | Swanson et al. |
| 2013/0291932 | A1 | 11/2013 | Bateman et al. |
| 2014/0020752 | A1 | 1/2014 | Arimoto et al. |
| 2014/0158192 | A1 | 6/2014 | Cudzinovic et al. |
| 2014/0166089 | A1 | 6/2014 | Shepherd et al. |
| 2014/0170800 | A1 | 6/2014 | Loscutoff et al. |
| 2014/0370644 | A1 | 12/2014 | Nakasu et al. |
| 2014/0372172 | A1 | 12/2014 | Martinez et al. |
| 2015/0372172 | A1 | 12/2015 | Kimoto |
| 2016/0056322 | A1 | 2/2016 | Yang |
| 2016/0126368 | A1 | 5/2016 | Lee et al. |
| 2016/0155866 | A1 | 6/2016 | Ha et al. |
| 2016/0155877 | A1 | 6/2016 | Chung et al. |
| 2016/0155885 | A1 | 6/2016 | Shim et al. |
| 2016/0181461 | A1 | 6/2016 | Ueyama et al. |
| 2016/0197210 | A1 | 7/2016 | Hayashi et al. |
| 2016/0240704 | A1 | 8/2016 | Shim |
| 2016/0240705 | A1 | 8/2016 | Takahama |
| 2016/0268454 | A1 | 9/2016 | Gwon |

FOREIGN PATENT DOCUMENTS

| | | |
|---|---|---|
| CN | 102856328 A | 1/2013 |
| CN | 103094377 A | 5/2013 |
| CN | 103875082 | 6/2014 |
| CN | 104011881 A | 8/2014 |
| CN | 105794004 | 7/2016 |
| CN | 108711579 | 10/2018 |
| DE | 112012005381 T5 | 9/2014 |
| DE | 112015005381 T5 | 8/2017 |
| JP | 2013133006 | 7/2015 |
| JP | 2013133006 A1 | 7/2015 |
| TW | 201203594 | 1/2012 |
| TW | 201415650 | 4/2014 |
| WO | WO 03047005 | 6/2003 |
| WO | WO 2007/130188 | 11/2007 |
| WO | WO 2008/115814 | 9/2008 |
| WO | WO 2012/132615 | 10/2012 |
| WO | WO2013/096500 A1 | 6/2013 |
| WO | 2013133006 A1 | 9/2013 |
| WO | WO 2014/136715 | 9/2014 |

OTHER PUBLICATIONS

International Preliminary Report on Patentability for PCT Patent Application No. PCT/US2015/050298 mailed Dec. 20, 2013, 36 pgs.
Pre-Interview First Office Action from U.S. Appl. No. 14/491,045 mailed Oct. 30, 2015, 4 pgs.
International Search Report and Written Opinion from PCT/US2015/050298 mailed Dec. 23, 2015, 14 pgs.
FAI Office Action from U.S. Appl. No. 14/491,045 mailed Mar. 28, 2016, 5 pgs.
Final Rejection from U.S. Appl. No. 14/491,045 mailed Aug. 10, 2016, 21 pgs.
Non-Final Office Action from U.S. Appl. No. 14/491,045 mailed Feb. 10, 2017, 26 pgs.
First Office Action for Chinese Patent Application No. 2015800565777, issued Jun. 5, 2018; 10 pgs.
First Office Action from Taiwan Patent Application No. 104130858 mailed Apr. 26, 2019, 13 pgs.
Second Office Action for Chinese Patent Application No. 2015800565777 mailed May 5, 2019, 9 pgs.
First Action Interview Pre-Interview Communication from U.S. Appl. No. 15/831,362 dated Oct. 25, 2019, 20 pgs.
First Action Interview Office Action from U.S. Appl. No. 15/831,362 dated Jan. 30, 2020, 6 pgs.
Office Action from Taiwanese Patent Application No. 104130858 dated Feb. 12, 2020, 8 pgs.
Third Office Action from Chinese Patent Application No. 2015800565777 dated Mar. 2, 2020, 18 pgs.
Fourth Office Action from Chinese Patent Application No. 2015800565777 dated Aug. 5, 2020, 7 pgs.
Office Action from Taiwan Patent Application No. 104130858 dated Oct. 13, 2020, 12 pgs.
Fifth Office Action from Chinese Patent Application No. 2015800565777 dated Mar. 8, 2021, 12 pgs.
First Action Interview Pre-Interview Communication from U.S. Appl. No. 17/068,748 dated May 12, 2022, 10 pgs.
First Action Interview Office Action from U.S. Appl. No. 17/068,748 dated Jul. 20, 2022, 4 pgs.
Office Action from German Patent Application No. 11 2015 004 246.6 dated Jan. 29, 2024, 11 pgs.
Notification of the First Office Action from Chinese Patent Application No. 202111401548.3 dated Jan. 24, 2024, 22 pgs.
Second Office Action for Chinese Divisional Application No. 202111401548.3 dated Sep. 20, 2024, 14 pages.

* cited by examiner

SOLAR CELL EMITTER REGION FABRICATION WITH DIFFERENTIATED P-TYPE AND N-TYPE ARCHITECTURES AND INCORPORATING DOTTED DIFFUSION

CROSS-REFERENCE TO RELATED APPLICATIONS

This application is a continuation of U.S. patent application Ser. No. 17/068,748, filed on Oct. 12, 2020, which is a continuation of U.S. patent application Ser. No. 15/831,362, filed on Dec. 4, 2017, now U.S. Pat. No. 10,804,415 issued on Oct. 13, 2020, which is a divisional of U.S. patent application Ser. No. 14/491,045, filed on Sep. 19, 2014, now U.S. Pat. No. 9,837,576 issued on Dec. 5, 2017, the entire contents of which are hereby incorporated by reference herein.

TECHNICAL FIELD

Embodiments of the present disclosure are in the field of renewable energy and, in particular, methods of fabricating solar cell emitter regions with differentiated P-type and N-type architectures and incorporating dotted diffusion, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1-6 illustrate cross-sectional and plan views of various stages in the fabrication of a solar cell, in accordance with an embodiment of the present disclosure, wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell emitter regions with differentiated P-type and N-type architectures and incorporating dotted diffusion, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are solar cells. In one embodiment, a solar cell includes a substrate having a light-receiving surface and a back surface. A first polycrystalline silicon emitter region of a first conductivity type is disposed on a first thin dielectric layer disposed on the back surface of the substrate. A second polycrystalline silicon emitter region of a second, different, conductivity type is disposed on a second thin dielectric layer disposed in a plurality of non-continuous trenches in the back surface of the substrate.

Also disclosed herein are methods of fabricating solar cells. In one embodiment, a method of fabricating a solar cell involves forming a first silicon layer of a first conductivity type on a first thin dielectric layer formed on a back surface of a substrate to provide a first emitter region of the solar cell. The substrate has a light-receiving surface and the back surface. The method also involves forming an insulator layer on the first silicon layer. The method also involves forming a plurality of openings in the insulator layer and the first silicon layer and a corresponding plurality of non-continuous trenches in the back surface of the substrate. The method also involves forming a second silicon layer of a second, different, conductivity type on a second thin dielectric layer formed in the plurality of non-continuous trenches to provide a second emitter region of the solar cell.

In another embodiment, a method of fabricating alternating N-type and P-type emitter regions of a solar cell involves forming a P-type silicon layer on a first thin dielectric layer formed on a back surface of an N-type monocrystalline silicon substrate. The method also involves forming an insulating layer on the P-type silicon layer. The method also involves patterning the insulating layer and the P-type silicon layer by laser ablation to form P-type silicon regions having an insulating cap thereon and to expose a plurality of regions of the N-type monocrystalline silicon substrate, each of the plurality of regions of the N-type monocrystalline silicon substrate having a plurality of non-continuous trenches formed in the N-type monocrystalline silicon substrate. The method also involves forming a second thin dielectric layer on exposed sides of the P-type silicon regions. The method also involves forming an N-type silicon layer on the second thin dielectric layer, on the insulating cap of the P-type silicon regions, and on a third thin dielectric layer formed in each of the plurality of non-continuous trenches of each of the plurality of regions of the N-type monocrystalline silicon substrate. The method also involves patterning the N-type silicon layer to form isolated N-type silicon regions and to form contact openings in regions of the N-type silicon layer above the insulating cap of the P-type silicon regions, each isolated N-type silicon region electrically coupled to a corresponding one of the plurality of regions of the N-type monocrystalline silicon substrate. The method also involves forming a plurality of conductive contacts, each conductive contact electrically connected to one of the P-type silicon regions or one of the isolated N-type silicon regions.

One or more embodiments described herein are directed to the fabrication of a solar cell with dotted diffusion. In an embodiment, implementing a dotted-diffusion design with a differentiated P-type and N-type architecture enables the fabrication of laser patterned emitters with more stable and lower reverse bias breakdown. The dotted diffusion may be fabricated using laser ablation, as described in greater detail below. However, in other embodiment, non-laser island diffusion formation may also be implemented, e.g., through the use of printed etchants, or through masking and etching approaches.

To provide context, using a laser to pattern an emitter in a traditional solar cell architecture may be challenging since, with a linear emitter, a significant area of material requires removal. The removal may be difficult to perform and may pose a units per hour (UPH) challenge when diode-pumped solid state (DPSS) lasers are used. Some designs also rely on an edge vertical sidewall junction as a pathway for reverse-bias breakdown, and therefore need to be very uniform. Use of a "clean" laser process to form such an edge vertical sidewall junction may be difficult where overlapping dots are used, as would normally be the case for a pulsed laser forming a continuous emitter. Reverse break-down voltage is also proportional to the length of the butting junction that serves as the break-down region.

Addressing one or more of the above issues, in an embodiment, moving to a dotted design, where the spot size can be easily controlled, and high-densities of dots can be placed, may lead to improved break-down performance of the device. In particular embodiments, forming an array of dots as the emitter can enable faster laser processing, more uniform ablation (e.g., non-overlapping dots) for better sidewalls, use of lower-energies (e.g., opens up UV laser opens, which is also better for side-wall uniformity), and can improve the breakdown-voltage. Other benefits of using a dotted emitter design with a differentiated P-type and N-type architecture may include one or more of (1) increasing junction area to enable lower breakdown voltage; (2) eliminating a need for overlap to form a continuous emitter; (3) improving UPH issues; (4) improving edge-overlap and control issue; (5) reducing island contacting issues by using blanket N-type amorphous silicon (n-a-Si) deposition; (6) enabling the formation of single, double, triples etc. rows of discrete N-type regions of the substrate ('N-islands'); (7) enabling tuning of island size; and/or (8) enabling use of a UV or $CO_2$ based laser source to cleanly remove a oxide and create clean side-walls, without significant damage to the emitter.

In a first exemplary process flow, FIGS. 1-6 illustrate cross-sectional views of various stages in the fabrication of a solar cell, in accordance with an embodiment of the present disclosure. FIG. 7 is a flowchart 700 listing operations in a method of fabricating a solar cell as corresponding to FIGS. 1-6, in accordance with an embodiment of the present disclosure.

Figure 1:
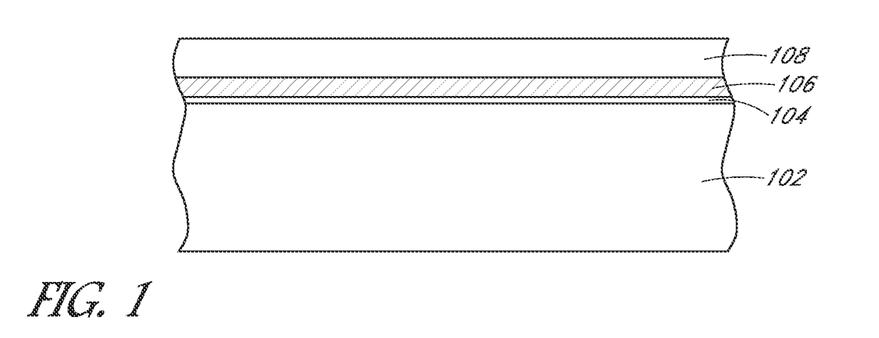
FIG. 1 illustrates a cross-sectional view of a stage in solar cell fabrication involving forming a first silicon layer of a first conductivity type on a first thin dielectric layer formed on a back surface of a substrate.

Referring to FIG. 1 and corresponding operation 702 of flowchart 700, a method of fabricating alternating N-type and P-type emitter regions of a solar cell involves forming a first silicon layer 106 of a first conductivity type on a first thin dielectric layer 104 formed on a back surface of a substrate 102.

In an embodiment, the substrate 102 is a monocrystalline silicon substrate, such as a bulk single crystalline N-type doped silicon substrate. It is to be understood, however, that substrate 102 may be a layer, such as a multi-crystalline silicon layer, disposed on a global solar cell substrate. In an embodiment, the first thin dielectric layer 104 is a thin oxide layer such as a tunnel dielectric silicon oxide layer having a thickness of approximately 2 nanometers or less.

In an embodiment, the first silicon layer 106 is a polycrystalline silicon layer that is doped to have the first conductivity type either through in situ doping, post deposition implanting, or a combination thereof. In another embodiment the first silicon layer 106 is an amorphous silicon layer such as a hydrogenated silicon layer represented by a-Si:H which is implanted with dopants of the first conductivity type subsequent to deposition of the amorphous silicon layer. In one such embodiment, the first silicon layer 106 is subsequently annealed (at least at some subsequent stage of the process flow) to ultimately form a polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the first conductivity type is P-type (e.g., formed using boron impurity atoms).

Referring again to FIG. 1 and now to corresponding operation 704 of flowchart 700, an insulating layer 108 is formed on the first silicon layer 106. In an embodiment the insulating layer 108 includes silicon dioxide.

Figure 2:
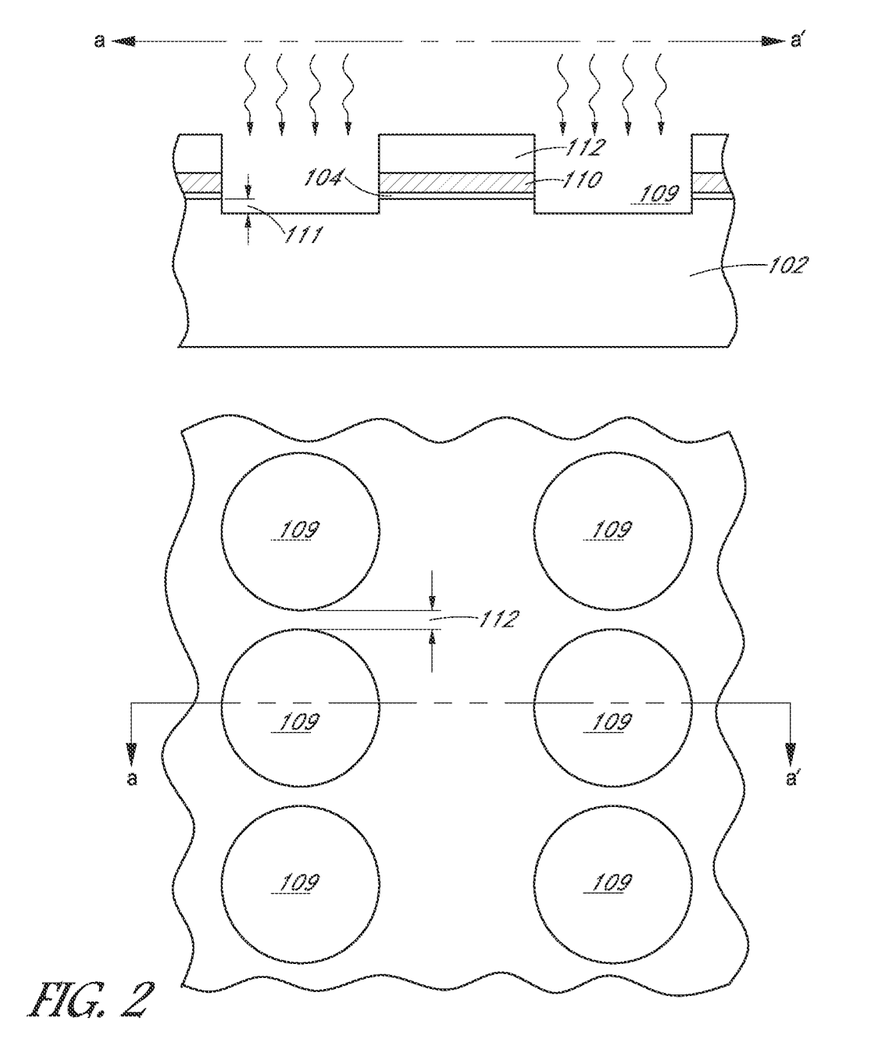
FIG. 2 illustrates a cross-sectional view and corresponding plan view of the structure of FIG. 1 following patterning of the insulating layer and the first silicon layer to form a first silicon region of the first conductivity type having an insulating cap thereon.

Referring to FIG. 2 and corresponding operation 706 of flowchart 700, the insulating layer 108 and the first silicon layer 106 are patterned to form a first silicon region 110 of the first conductivity type having an insulating cap 112 thereon. In an embodiment, a laser ablation process (e.g., direct write) is used to pattern the insulating layer 108 and the first silicon layer 106. Where applicable, in one embodiment, the first thin dielectric layer 104 is also patterned in the process, as is depicted in FIG. 2. It is to be appreciated that the cross-sectional view of FIG. 2 is taken along the a-a' axis of the plan view of FIG. 2.

In an embodiment, the laser ablation process of FIG. 2 exposes a plurality of regions 109 of an N-type monocrystalline silicon substrate 102. Each of the plurality of regions 109 of the N-type monocrystalline silicon substrate 102 can be viewed as a plurality of non-continuous trenches 111 (seen in the cross-sectional view) having a spacing 112 between trenches (spacing seen in the plan view) formed in the N-type monocrystalline silicon substrate 102. The option that the trenches 109 have a depth or thickness 111 into the substrate is depicted in the cross-sectional view of FIG. 2. In one such embodiment, each of the plurality of non-continuous trenches 109 is formed to a non-zero depth 111 less than approximately 10 microns into the substrate 102 upon laser ablation.

As mentioned above, the plurality of openings and the corresponding plurality of non-continuous trenches 109 may be formed by applying a laser ablation process. In an embodiment, using the laser ablation process provides each of the plurality of non-continuous trenches with a width (e.g., maximum diameter) approximately in the range of 30-60 microns. In one such embodiment, successive ones of the plurality of non-continuous trenches 109 is formed as spaced apart at a distance approximately in the range of 50-300 microns. A distance of much less than 50 microns may lead to possibility of overlap of trenches, which may not be desirable, as described above. On the other hand, a distance of much greater than 300 microns may lead to increased contact resistance for a contact subsequently formed and linking several of the trenches 109. In an embodiment, the laser ablation process involves using a laser beam having an approximately Gaussian profile or having an approximately flat-top profile.

Figure 3:
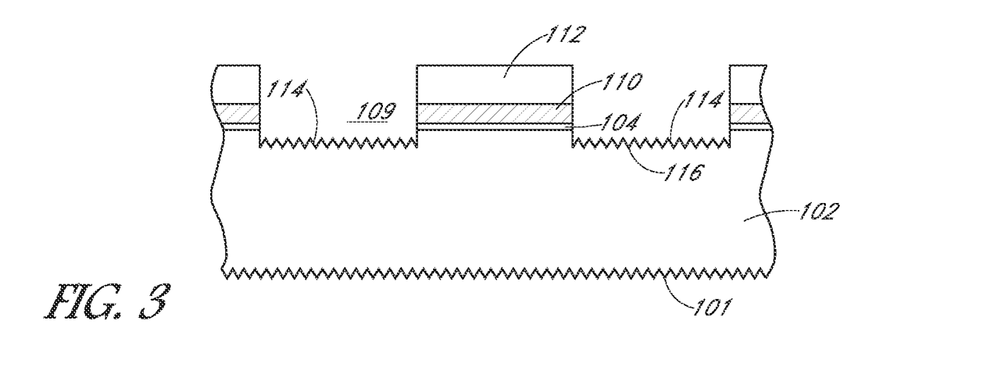
FIG. 3 illustrates a cross-sectional view of the structure of FIG. 2 following texturing of the surfaces of the trenches to form texturized recesses or trenches having texturized surfaces within the substrate.

Referring to FIG. 3, optionally, the surfaces of the trenches 109 may be texturized to form texturized recesses or trenches 114 having texturized surfaces 116 within the substrate 102. In a same or similar process, a light receiving surface 101 of the substrate 102 may also be texturized, as is depicted in FIG. 3. In an embodiment, a hydroxide-based wet etchant is used to form at least a portion of the recesses 114 and/or to texturize exposed portions of the substrate 102. A texturized surface may be one which has a regular or an irregular shaped surface for scattering incoming light, decreasing the amount of light reflected off of the light-receiving and/or exposed surfaces of the solar cell. It is to be appreciated, however, that the texturizing of the back surface and even the recess formation may be omitted from the process flow. It is also to be appreciated that, if applied, the texturizing may increase the depth of the trenches 109 from the originally formed depth.

Figure 4:
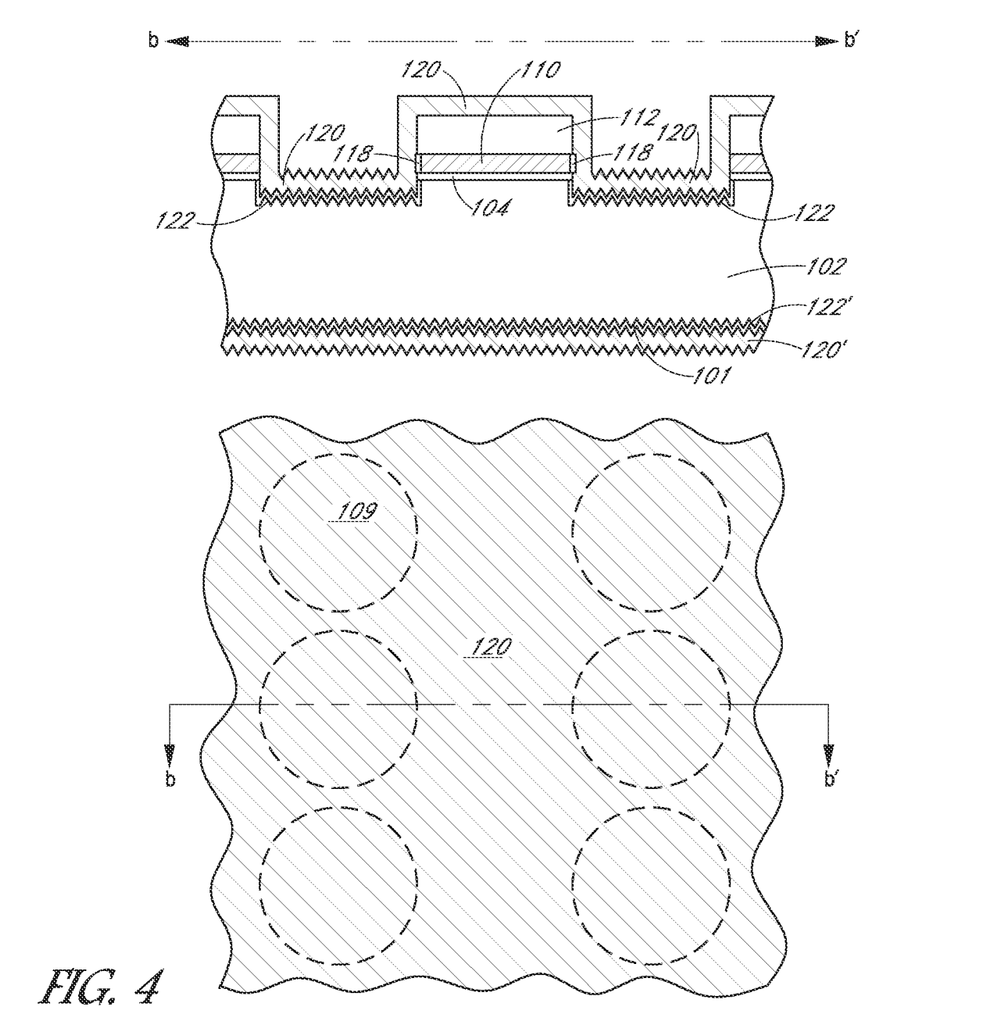
FIG. 4 illustrates a cross-sectional view and corresponding plan view of the structure of FIG. 3 following formation of second and third thin dielectric layers and a second silicon layer.

Referring to FIG. 4 and corresponding operation 708 of flowchart 700, a second thin dielectric layer 118 is formed on exposed sides of the first silicon regions 118. In an embodiment, the second thin dielectric layer 118 is formed in an oxidation process and is a thin oxide layer such as a tunnel dielectric silicon oxide layer having a thickness of approximately 2 nanometers or less. In another embodiment, the second thin dielectric layer 118 is formed in a deposition process and is a thin silicon nitride layer or silicon oxynitride layer. It is to be appreciated that the cross-sectional view of FIG. 4 is taken along the b-b' axis of the plan view of FIG. 4.

Referring again to FIG. 4 and now to corresponding operation 710 of flowchart 700, a second silicon layer 120 of a second, different, conductivity type is formed on a third thin dielectric layer 122 formed on the exposed portions of the back surface of the substrate 102 (e.g., formed in each of the plurality of non-continuous trenches 109 of each of the plurality of regions of the N-type monocrystalline silicon substrate 102), and on the second thin dielectric layer 118 and the insulating cap 112 of the first silicon regions 110. As seen in both the cross-sectional view and the plan view, the second silicon layer 120 covers (from a top-down perspective) the trench regions 109.

Referring again to FIG. 4, corresponding thin dielectric layer 122' and second silicon layer 120' of the second conductivity type may also be formed on the light-receiving surface 101 of the substrate 102, in same or similar process operations, as is also depicted in FIG. 4. Additionally, although not depicted, an ARC layer may be formed on the corresponding second silicon layer 120'.

In an embodiment, the third thin dielectric layer 122 is formed in an oxidation process and is a thin oxide layer such as a tunnel dielectric silicon oxide layer having a thickness of approximately 2 nanometers or less. In an embodiment, the second silicon layer 120 is a polycrystalline silicon layer that is doped to have the second conductivity type either through in situ doping, post deposition implanting, or a combination thereof. In another embodiment the second silicon layer 120 is an amorphous silicon layer such as a hydrogenated silicon layer represented by a-Si:H which is implanted with dopants of the second conductivity type subsequent to deposition of the amorphous silicon layer. In one such embodiment, the second silicon layer 120 is subsequently annealed (at least at some subsequent stage of the process flow) to ultimately form a polycrystalline silicon layer. In an embodiment, for either a polycrystalline silicon layer or an amorphous silicon layer, if post deposition implantation is performed, the implanting is performed by using ion beam implantation or plasma immersion implantation. In one such embodiment, a shadow mask is used for the implanting. In a specific embodiment, the second conductivity type is N-type (e.g., formed using phosphorus atoms or arsenic impurity atoms).

Figure 5:
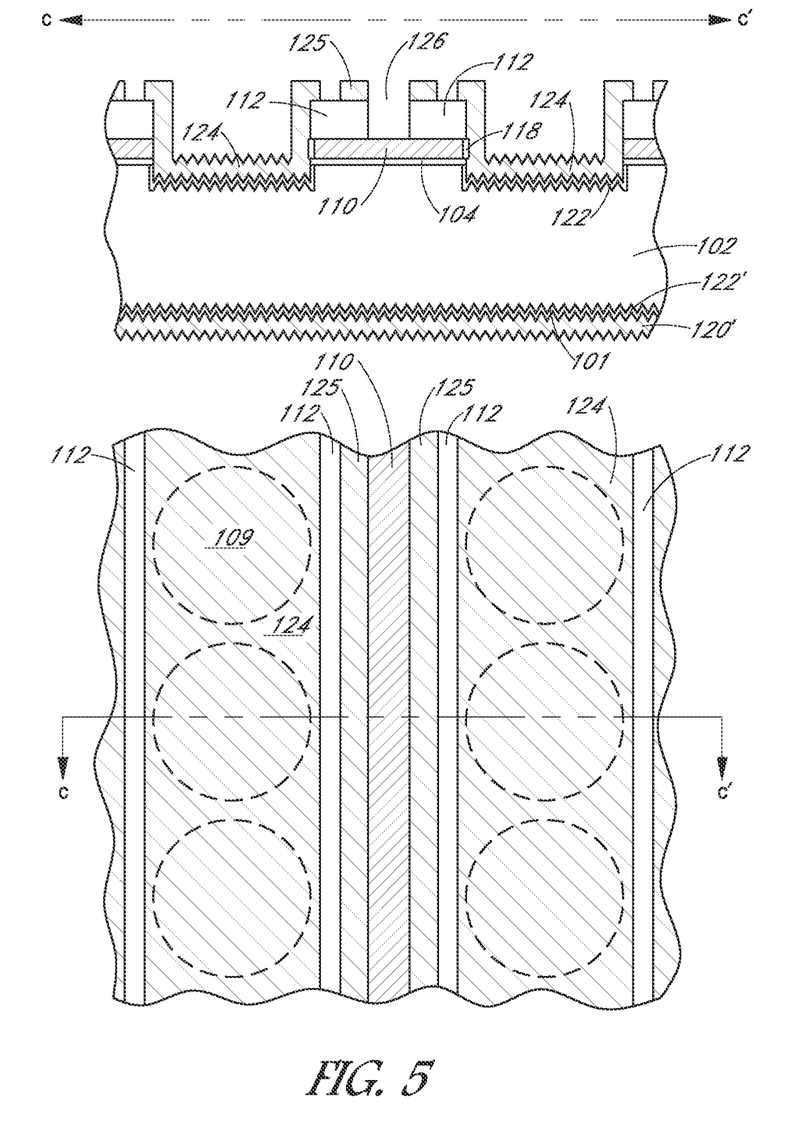
FIG. 5 illustrates a cross-sectional view and corresponding plan view of the structure of FIG. 4 following patterning of the second silicon layer to form isolated second silicon regions and to form a contact opening in regions of the second silicon layer above the insulating cap of the first silicon regions.

Referring to FIG. 5 and corresponding operation 712 of flowchart 700, the second silicon layer 120 is patterned to form isolated second silicon regions 124 of the second conductivity type and to form a contact opening 126 in regions of the second silicon layer 120 above the insulating cap 112 of the first silicon regions 110. In an embodiment, each isolated N-type silicon region 124 is electrically coupled to a corresponding one (or more) of the plurality of regions 109 of the N-type monocrystalline silicon substrate 102. In an embodiment, discrete regions of silicon 125 may remain as an artifact of the patterning process. In an embodiment, a laser ablation process is used to pattern the second silicon layer 120. It is to be appreciated that the cross-sectional view of FIG. 5 is taken along the c-c' axis of the plan view of FIG. 5.

Referring again to FIG. 5, the insulating cap 112 is patterned through the contact openings 126 to expose portions of the first silicon regions 110. In an embodiment, the insulating cap 112 is patterned using a laser ablation process. For example, in one embodiment, a first laser pass is used to pattern the second silicon layer 120, including forming contact opening 126. A second laser pass in the same location as contact opening 126 is the used to pattern the insulating cap 112. As seen from the plan view of FIG. 5, in an embodiment, a single isolated region 124 (e.g., a single isolated N-type silicon region) covers, from a top-down perspective, a strip of a plurality of the openings 109 (a strip of three openings per single isolated region 124 is shown in FIG. 5).

Figure 6:
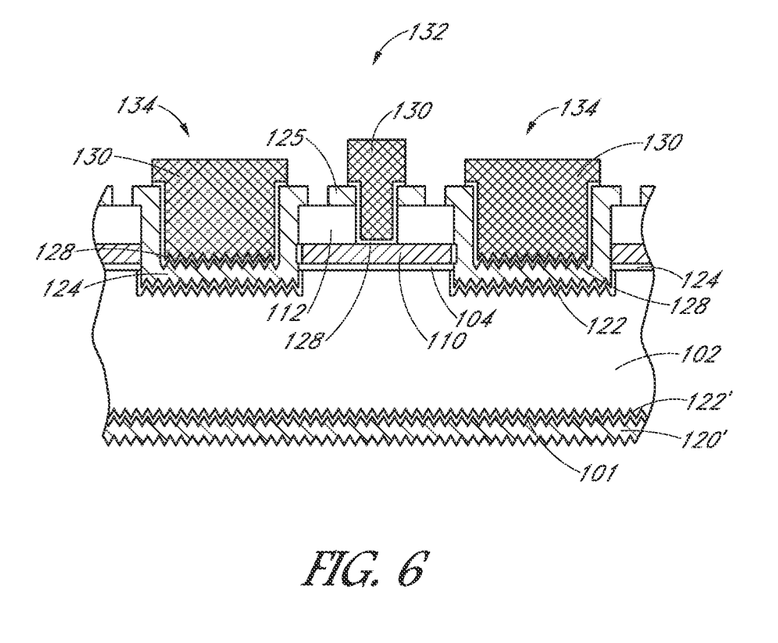
FIG. 6 illustrates a cross-sectional view of the structure of FIG. 5 following formation of a plurality of conductive contacts.
Figure 7:
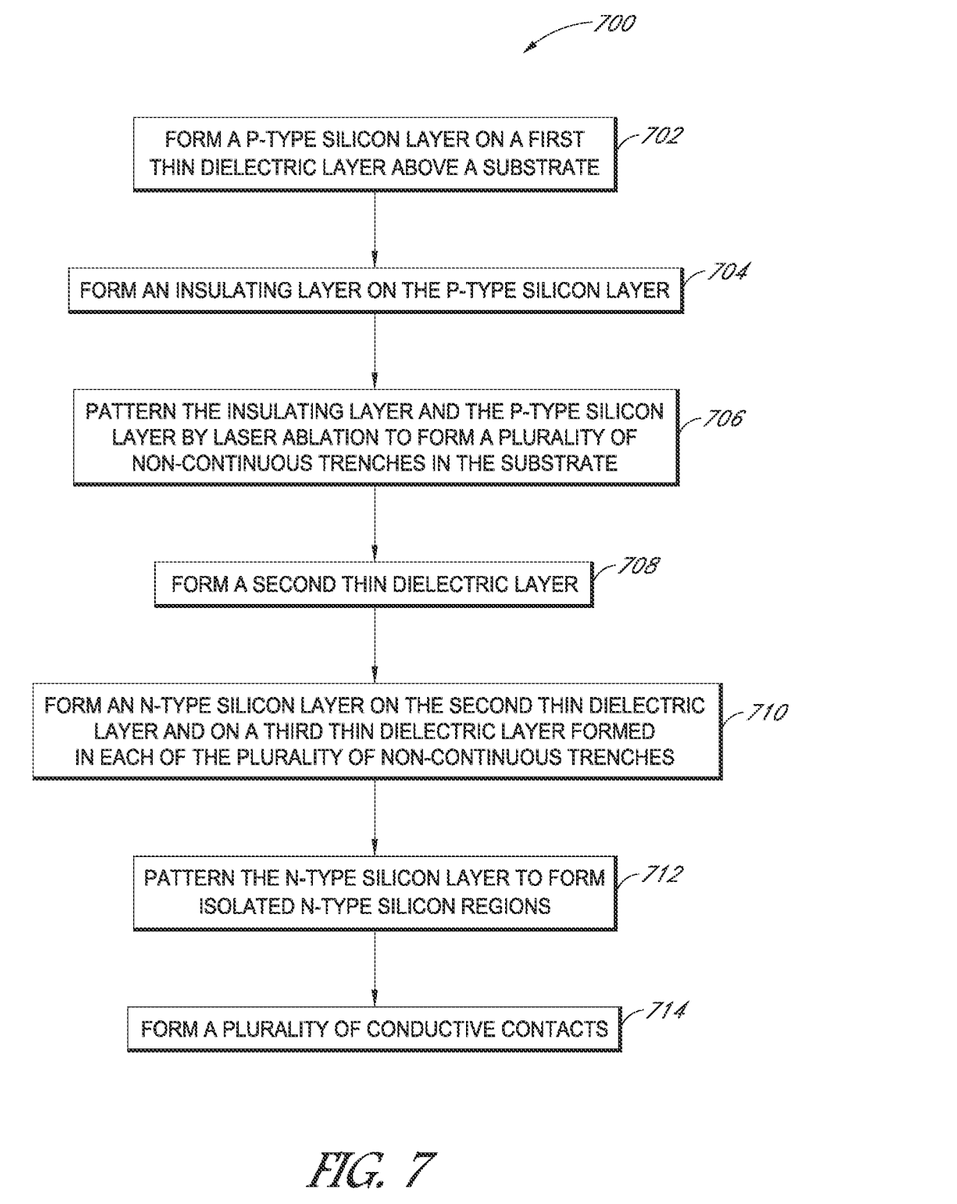
FIG. 7 is a flowchart listing operations in a method of fabricating a solar cell as corresponding to FIGS. 1-6, in accordance with an embodiment of the present disclosure.

Referring to FIG. 6 and corresponding operation 714 of flowchart 700, a plurality of conductive contacts is formed, each conductive contact electrically connected to one of the P-type silicon regions or one of the isolated N-type silicon regions. In an exemplary embodiment, a metal seed layer 128 is formed on the exposed portions of the first silicon regions 110 and on the isolated second silicon regions 124. A metal layer 130 is then plated on the metal seed layer to form conductive contacts 132 and 134, respectively, for the first silicon regions 110 and the isolated second silicon regions 124. In an embodiment, the metal seed layer 128 is an aluminum-based metal seed layer, and the metal layer 130 is a copper layer. In an embodiment, a mask is first formed to expose only the exposed portions of the first silicon regions 110 and the isolated second silicon regions 124 in order to direct the metal seed layer 128 formation to restricted locations.

Thus, one or more embodiments described herein are directed to forming P+ and N+ polysilicon emitter regions for a solar cell where the respective structures of the P+ and N+ polysilicon emitter regions are different from one another. Such an approach can be implemented to simplify a solar cell fabrication process. Furthermore, the resulting structure may provide a lower breakdown voltage and lower power losses associated as compared with other solar cell architectures.

With reference again to FIG. 6, in an embodiment, a finalized solar cell includes a substrate 102 having a light-receiving surface 101 and a corresponding back surface. A first polycrystalline silicon emitter region 110 of a first conductivity type is disposed on a first thin dielectric layer 104 disposed on the back surface of the substrate 102. A second polycrystalline silicon emitter region 124 of a second, different, conductivity type is disposed on a second thin dielectric layer 122 disposed in a plurality of non-continuous trenches (shown as recess in cross-sectional view of FIG. 6) in the back surface of the substrate 102. In an embodiment, the substrate 102 is an N-type monocrystalline silicon substrate, the first conductivity type is P-type, and the second conductivity type is N-type. In an embodiment, the solar cell is a back contact solar cell, as is depicted in FIG. 6.

In an embodiment, each of the plurality of non-continuous trenches has a width approximately in the range of 30-60 microns, as was described in association with FIG. 2. In an embodiment, successive ones of the plurality of non-continuous trenches are spaced apart at a distance approximately in the range of 50-300 microns, as was also described in association with FIG. 2. In an embodiment, each of the plurality of non-continuous trenches has a depth approximately in the range of 0.5-10 microns, as taken from the back surface and into the substrate 102. The final trench depth may be formed from laser ablation, a texturizing process, or both. In an embodiment, each of the non-continuous trenches has an approximately circular shape, as depicted in the plan views of FIGS. 2, 4 and 5. As depicted in FIG. 6, each of the non-continuous trenches has a texturized surface.

Referring again to FIG. 6, in an embodiment, the solar cell further includes a third thin dielectric layer 118 disposed laterally directly between the first 110 and second 124 polycrystalline silicon emitter regions. In an embodiment, the solar cell further includes a first conductive contact structure 130 electrically connected to the first polycrystalline silicon emitter region 110, and a second conductive contact structure 134 electrically connected to the second polycrystalline silicon emitter region 124. In an embodiment, the solar cell further includes an insulator layer 112 disposed on the first polycrystalline silicon emitter region 110. The first conductive contact structure 130 is disposed through the insulator layer 112. In one such embodiment, a portion of the second polycrystalline silicon emitter region 124 overlaps the insulator layer 112 but is separated from the first conductive contact structure 130, as is depicted in FIG. 6. In a further embodiment, a polycrystalline silicon region 125 of the second conductivity type is disposed on the insulator layer 112, and the first conductive contact structure 130 is disposed through the polycrystalline silicon region 125 of the second conductivity type and through the insulator layer 112, as is depicted in FIG. 6.

In another aspect, one or more embodiments described herein are directed to silicide formation for solar cell fabrication. The silicide material can be incorporated into a final solar cell structure, such as a back contact or front contact solar cell structure. Using a silicide material for metallization of a polysilicon emitter region of a solar cell can provide a simpler metallization process for such solar cells. For example, as described in greater detail below, a silicide technique is used to effectively remove a masking operation from a metal seed layer process for contact formation. Furthermore, alignment issues can be reduced since the silicide process is a self-aligned process.

Figure 8A:
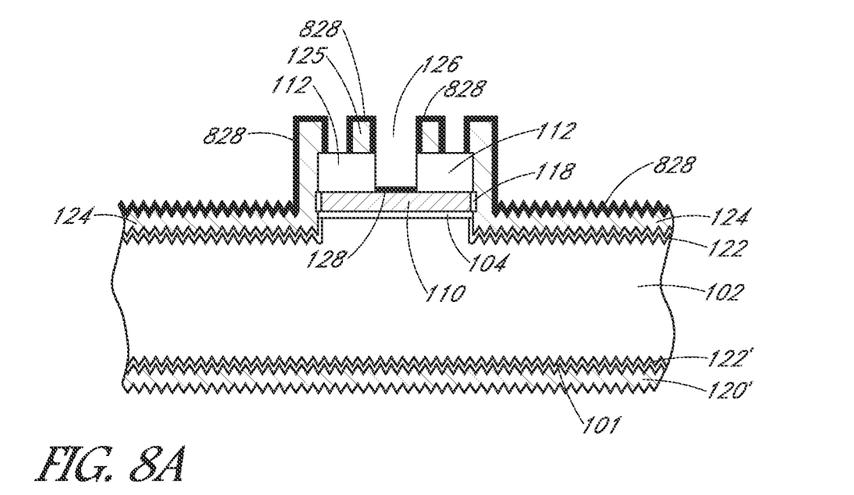
FIGS. 8A and 8B illustrate cross-sectional views of various stages in the fabrication of another solar cell, in accordance with another embodiment of the present disclosure.
Figure 8B:
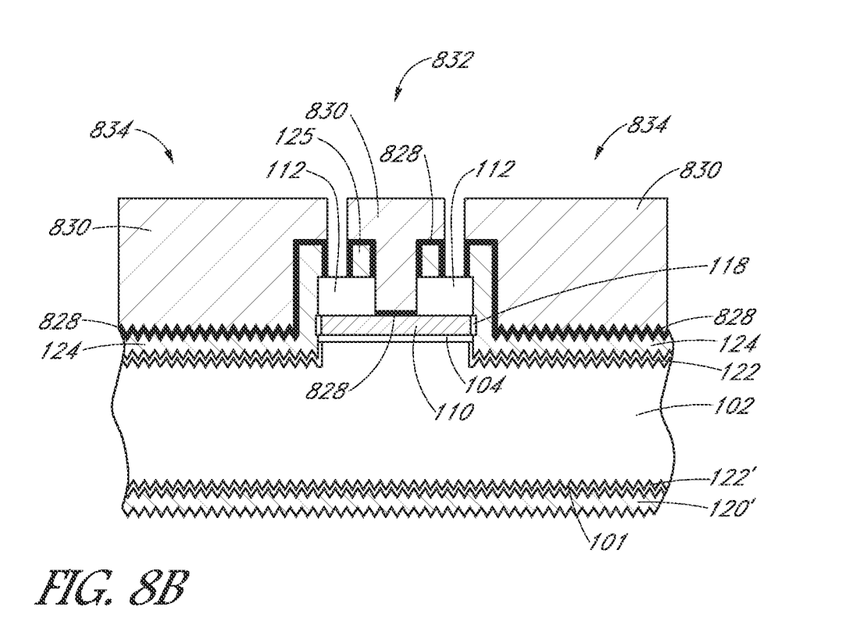

In a second exemplary process flow, FIGS. 8A-8B illustrate cross-sectional views of various stages in the fabrication of another solar cell, in accordance with another embodiment of the present disclosure. The second exemplary process flow moves from the structure of FIG. 5 to the structure of FIG. 8A.

Referring to FIG. 8A, subsequent to patterning the second silicon layer 120 and the insulating cap 112 (as described in association with FIG. 5), a metal silicide layer 828 is formed from exposed surfaces of the patterned second silicon layer and from the exposed portions of the first silicon regions 110. In an embodiment, the metal silicide layer is formed by forming a blanket metal layer over the entire structure of FIG. 5, heating the blanket metal layer to react with exposed silicon and form a metal silicide. Unreacted portions of the blanket metal layer are then removed, e.g., using a wet chemical clean process that is selective to the formed silicide material. In one embodiment, the metal silicide layer 828 includes a material such as, but not limited to, titanium silicide ($TiSi_2$), cobalt silicide ($CoSi_2$), tungsten silicide ($WSi_2$), or nickel silicide (NiSi or $NiSi_2$). In an embodiment, a rapid thermal processing (RTP) anneal is used to form the silicide. In that embodiment, dopants in the silicon layers of the emitter region are activated in the same RTP process. In one embodiment, the RTP process is performed in an oxygen-free or low oxygen environment to reduce oxidation of the silicide metal. However, in another embodiment, a silicide process temperature is lower than the temperature of a separate anneal used for dopant activation.

Referring to FIG. 8B, a metal layer 830 is the plated on the metal silicide layer to form conductive contacts 832 and 834, respectively, for the first silicon regions 110 and the isolated second silicon regions 124. In one embodiment, the metal layer 830 is a copper layer. In one embodiment, the metal silicide layer is chemically activated prior to plating a metal thereon. In another embodiment, instead of plating a metal, an aluminum (Al) foil welding process is used to complete the contact formation.

It is to be appreciated that the silicidation process for contact formation described in association with FIGS. 8A and 8B, as contrasted to the contact formation described in association with FIG. 6, uses one less mask. In particular, a seed layer does not need to be directed by a mask in the silicidation process since silicide will form only on regions of exposed silicon, which have already been patterned. As such, in an embodiment, the silicidation process is a self-aligned process which can be implemented to mitigate alignment issues and, possibly, reduce the pitch achievable for cell contact fabrication.

Figure 9:
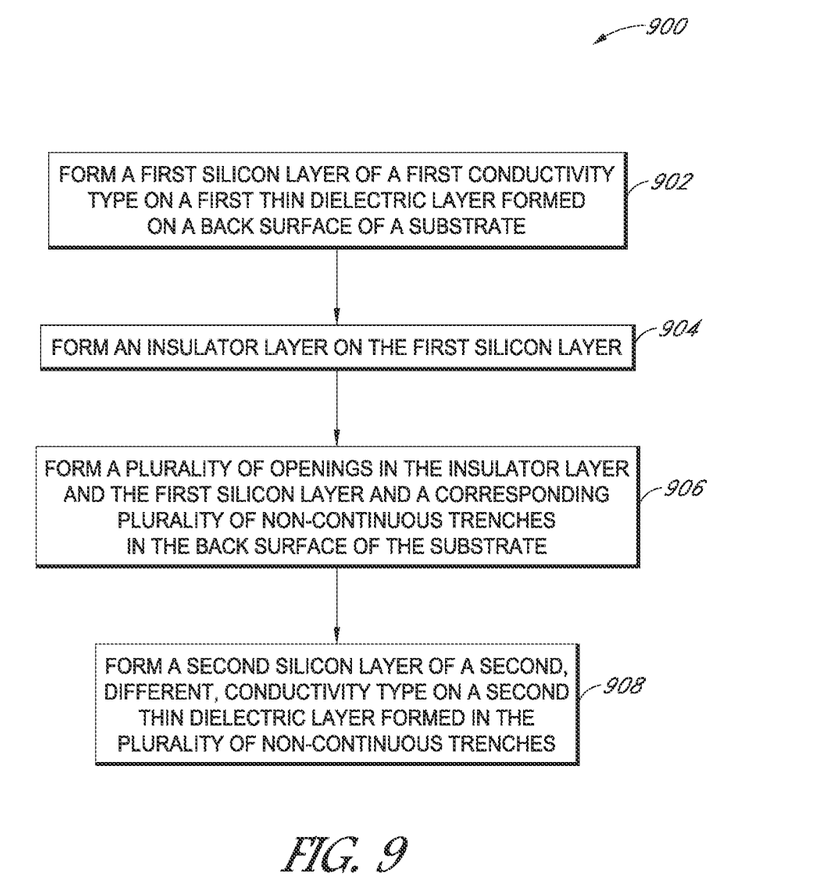
FIG. 9 is a flowchart listing operations in another method of fabricating a solar cell, in accordance with an embodiment of the present disclosure.

Perhaps more generally, a process encompassing both of the above described process flows is described in association with FIG. 9. FIG. 9 is a flowchart 900 listing operations in another method of fabricating a solar cell, in accordance with an embodiment of the present disclosure. Referring to operation 902 of the flowchart 900 of FIG. 9, a method of fabricating a solar cell involves forming a first silicon layer of a first conductivity type on a first thin dielectric layer formed on a back surface of a substrate. In an embodiment, this process operation provides a first emitter region of the solar cell. Referring to operation 904 of the flowchart 900 of FIG. 9, the method also involves forming an insulator layer on the first silicon layer. Referring to operation 906 of the flowchart 900 of FIG. 9, the method also involves forming a plurality of openings in the insulator layer and the first silicon layer, and a corresponding plurality of non-continuous trenches in the back surface of the substrate. Referring to operation 908 of the flowchart 900 of FIG. 9, the method also involves forming a second silicon layer of a second, different, conductivity type on a second thin dielectric layer formed in the plurality of non-continuous trenches. In an embodiment, this process operation provides a second emitter region of the solar cell.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Furthermore, in an embodiment, a cluster plasma enhanced chemical vapor deposition (PECVD) tool can be used to combine many of the above described process operations in a single pass in a process tool. For example, in one such embodiment, up to four distinct PECVD operations and an RTP operation can be performed in a single pass in a cluster tool. The PECVD operations can includes depositions of layers such as the above described back side P+ polysilicon layer, both front and back side N+ polysilicon layers, and the ARC layer.

Thus, methods of fabricating solar cell emitter regions with differentiated P-type and N-type architectures and incorporating dotted diffusion, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a substrate having a light-receiving surface and a back surface;
   a first dielectric layer on the back surface of the substrate;
   a p-type silicon layer on the first dielectric layer;
   a second dielectric layer over a plurality of non-continuous regions at the back surface of the substrate;
   a plurality of isolated n-type silicon layer features on the second dielectric layer;
   a first conductive contact structure electrically connected to the p-type silicon layer;
   an insulator layer on the p-type silicon layer, wherein the first conductive contact structure is through the insulator layer, and wherein a portion of the plurality of isolated n-type silicon layer features overlaps the insulator layer but is separated from the first conductive contact structure;
   a second conductive contact structure electrically connected to the plurality of isolated n-type silicon layer features, wherein the second conductive contact structure is over the plurality of isolated n-type silicon layer features and a first portion of the insulator layer; and
   a third dielectric layer between the p-type silicon layer and at least one of the plurality of isolated n-type silicon layer features, the third dielectric layer having an uppermost surface co-planar with an uppermost surface of the p-type silicon layer.

2. The solar cell of claim 1, wherein the portion of the first portion of the insulator layer is between two non-continuous regions at the back surface of the substrate.

3. The solar cell of claim 1, wherein each of the plurality of non-continuous regions has a width approximately in the range of 30-60 microns, and wherein successive ones of the plurality of non-continuous regions are spaced apart at a distance approximately in the range of 50-300 microns.

4. The solar cell of claim 1, wherein each of the plurality of non-continuous regions has a depth approximately in the range of 0.5-10 microns from the back surface and into the substrate.

5. The solar cell of claim 1, wherein each of the non-continuous regions has an approximately circular shape.

6. The solar cell of claim 1, wherein each of the non-continuous regions has a texturized surface.

7. The solar cell of claim 6, wherein the second dielectric layer is confined to the plurality of non-continuous regions and is conformal with the texturized surface of the plurality of non-continuous regions.

8. The solar cell of claim 1, wherein the second dielectric layer is physically separated from the first conductive contact structure.

9. The solar cell of claim 1, wherein the p-type silicon layer is laterally adjacent to at least one of the plurality of isolated n-type silicon layer features and is electrically isolated from the plurality of isolated n-type silicon layer features by the third dielectric layer, the third dielectric layer non-continuous with the second dielectric layer.

10. The solar cell of claim 9, wherein the third dielectric layer has a vertical thickness and a lateral thickness, and the vertical thickness is greater than the lateral thickness.

* * * * *